United States Patent [19]

Nadeau-Dostie et al.

[11] Patent Number: 5,349,587
[45] Date of Patent: Sep. 20, 1994

[54] MULTIPLE CLOCK RATE TEST APPARATUS FOR TESTING DIGITAL SYSTEMS

[75] Inventors: Benoit Nadeau-Dostie, Aylmer; Abu S. M. Hassan, Nepean; Dwayne M. Burek, Nepean; Stephen K. Sunter, Nepean, all of Canada

[73] Assignee: Northern Telecom Limited, Montreal, Canada

[21] Appl. No.: 858,377

[22] Filed: Mar. 26, 1992

[51] Int. Cl.$^5$ .................. A04B 17/00; G01R 31/28
[52] U.S. Cl. .......................... 371/22.3; 371/27
[58] Field of Search .............. 371/22.3, 22.4, 22.5, 371/22.6, 27

[56] References Cited

U.S. PATENT DOCUMENTS

| | | | |
|---|---|---|---|
| 3,781,829 | 12/1973 | Singh | 340/173 R |
| 4,503,537 | 3/1985 | McAnney | 371/25 |
| 4,759,021 | 7/1988 | Kawaguchi et al. | 371/27 |
| 4,849,702 | 7/1989 | West et al. | 371/27 |
| 4,897,838 | 1/1990 | Tateishi | 371/22.3 |
| 4,912,340 | 3/1990 | Wilcox et al. | 307/269 |
| 4,945,536 | 7/1990 | Honcu | 371/22.3 |
| 5,043,986 | 8/1991 | Argawal et al. | 371/22.3 |
| 5,159,598 | 10/1992 | Welles, II et al. | 371/22.3 |
| 5,265,102 | 11/1993 | Saito | 371/27 |

OTHER PUBLICATIONS

"Self-Testing of Multichip Logic Modules", Paul H. Bardell and William H. McAnney, IBM Corp., 1982 IEEE Test Conference.

Primary Examiner—Robert W. Beausoliel, Jr.
Assistant Examiner—Joseph E. Palys
Attorney, Agent, or Firm—C. W. Junkin

[57] ABSTRACT

In methods and apparatus for testing a digital system, scannable memory elements of the digital system are configured in a scan mode in which the memory elements are connected to define a plurality of scan chains. A test stimulus pattern is clocked into each of the scan chains at a respective clock rate, at least two of the clock rates being different from one another. The memory elements of each scan chain are then configured in a normal operation mode in which the memory elements are interconnected by the combinational network for at least one clock cycle at a highest of the respective clock rates. The memory elements are then reconfigured in the scan mode, and a test response pattern is clocked out of each of the scan chains at its respective clock rate. The methods and apparatus are particularly useful for testing digital systems such as digital integrated circuits in which different memory elements are clocked at different rates during normal operation.

19 Claims, 7 Drawing Sheets

MULTIPLE CLOCK RATE TEST APPARATUS FOR TESTING DIGITAL SYSTEMS

FIELD OF INVENTION

This invention relates generally to methods and apparatus for testing digital systems such as digital integrated circuits, and more particularly to methods and apparatus for testing such systems using scan testing techniques.

BACKGROUND OF INVENTION

Conventional digital integrated circuits comprise complex combinational networks for performing logical operations on data, and memory elements interconnected with the combinational networks to provide memory functions essential to the operation of the combinational networks. Such integrated circuits are difficult to test due to the complexity of their operation.

Modern digital integrated circuit designers incorporate test features in digital integrated circuits at the design stage to ensure that such circuits are testable. In one design technique, known as Level Sensitive Scan Design (LSSD), designers partition circuits into combinational networks and scannable memory elements, usually flip-flops. The flip-flops are made reconfigurable from their operating configuration (in which they are connected to the combinational networks of the circuit as required to support normal operation of the circuit) to a scan configuration in which they are decoupled from the combinational networks and connected in series to form one or more shift registers known as a "scan chains".

The scan configuration is used during testing of the circuit to shift a known test stimulus pattern into the scan chains. The flip-flops are then put into the operating configuration for at least one clock cycle so that the combinational networks perform logical operations on some of the data making up the test stimulus pattern and alter the data stored in some of the flip-flops. The flip-flops are then returned to the scan configuration to shift the altered data out of the scan chains as a test response pattern. The test response pattern is compared with a calculated test response pattern or with a test response pattern obtained from a circuit which is known to be functioning properly to determine whether the circuit under test is functioning properly.

U.S. Pat. No. 4,503,537 discloses apparatus for testing a multichip module in which a single random pattern generator supplies random test stimulus patterns in parallel to respective scan chains of digital integrated circuits (or "chips") making up the multichip module. A single signature register receives test response patterns in parallel from the respective scan chains of the integrated circuits for evaluation. (U.S. Pat. No. 4,503,537 issued Mar. 5, 1985 in the name of W.H. McAnney and is entitled "Parallel Path Self-Testing System".)

In the test apparatus disclosed in U.S. Pat. No. 4,503,537, the respective scan chains of the individual integrated circuits are all clocked at the same rate. This clock rate is limited by the longest propagation delay between scannable memory elements through the combinational networks of all integrated circuits making up the multichip module. If a higher clock rate were used, one or more of the combinational networks would not have adequate time to operate on the test stimulus pattern and the test response pattern would not accurately represent the operation of the combinational networks on the test stimulus pattern.

Where there is a distribution of propagation delays through the combinational networks between scannable memory elements, the apparatus of U.S. Pat. No. 4,503,537 tests some combinational networks at a clock rate which is lower than necessary, so that the time required to complete testing of those combinational networks is unduly long. Moreover, the clock rate for testing will generally be lower than the clock rate used during normal operation for at least some of the memory elements, so the test results may not accurately represent the operation of those memory elements and their associated combinational networks at normal operating speed. In particular, certain faults resulting from excessive propagation delays during normal circuit operation may go undetected.

SUMMARY OF INVENTION

The testing methods and apparatus of this invention obviate or mitigate some of the problems of known test methods and apparatus as described above.

One aspect of the invention provides a method for testing a digital system comprising a plurality of scannable memory elements and at least one combinational network. The method comprises the following steps:

1. configuring the memory elements in a scan mode in which the memory elements are connected to define a plurality of scan chains;
2. clocking a test stimulus pattern into each of the scan chains at a respective clock rate, at least two of the clock rates being different from one another;
3. configuring the memory elements of each scan chain in a normal operation mode in which the memory elements are interconnected by the combinational network for at least one clock cycle at a highest of the respective clock rates;
4. configuring the memory elements in the scan mode; and
5. clocking a test response pattern out of each of the scan chains at its respective clock rate.

Preferably, test stimulus patterns are clocked into all of the scan chains during overlapping time intervals, the memory elements of all scan chains are configured in normal operation mode during overlapping time intervals, and test response patterns are clocked out of all scan chains during overlapping time intervals to reduce the time required for testing. Where each scan chain consists of memory elements which are clocked at a single clock rate during normal operation, and the respective clock rate of each scan chain is made substantially equal to the clock rate during normal operation of its memory elements, the test will be reasonably representative of the digital system's operation at normal operating speed.

Another aspect of the invention provides a digital system adapted for scan testing. The digital system comprises at least one combinational network and a plurality of scannable memory elements. The memory elements are configurable in a normal operation mode in which the memory elements are interconnected by the combinational network, and are also configurable in a scan mode in which the memory elements are connected to define a plurality of scan chains. The digital system further comprises a multiple clock generator for generating multiple clock signals for clocking test patterns into and out of each of the scan chains at a respective clock rate, at least two of the clock rates being different from one another. The digital system also comprises a configuration controller for configuring the memory elements in scan mode to permit clocking of test stimulus patterns into each scan chain at its respective clock rate, for reconfiguring the memory elements in normal operation mode for at least one clock cycle at a highest of the respective clock rates, and for reconfiguring the memory elements in scan mode to permit clocking of test response patterns out of each scan chain at its respective clock rate.

Preferably, the digital system is implemented as an integrated circuit, and includes a test stimulus pattern generator and a test response pattern processor. Advantageously, the integrated circuit may include scannable memory elements at its data input terminals and data output terminals, those scannable memory elements being configurable as a boundary scan chain. The digital system may also include a test access port for receiving control signals from an external tester and sending test results to the external tester.

BRIEF DESCRIPTION OF ACCOMPANYING DRAWINGS

Embodiments of the invention are described below by way of example only. Reference is made to accompanying drawings, in which.

DESCRIPTION OF EMBODIMENTS

Figure 1:
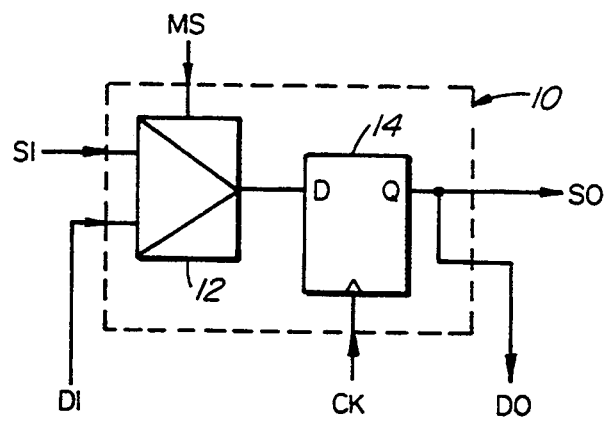
FIG. 1 is a block schematic diagram of a scannable memory element.

FIG. 1 is a block schematic diagram of a scannable memory element 10. The scannable memory element 10 comprises a data multiplexor 12 and an edge-triggered flip-flop 14. In response to a mode select signal MS, the multiplexor 12 selects either a scan input SI or a data input DI for application to a data input D of the flip-flop 14. The flip-flop 14 transfers the signal at its data input D in parallel to a scan output SO and a data output DO when triggered by a clock signal CK.

Figure 2:
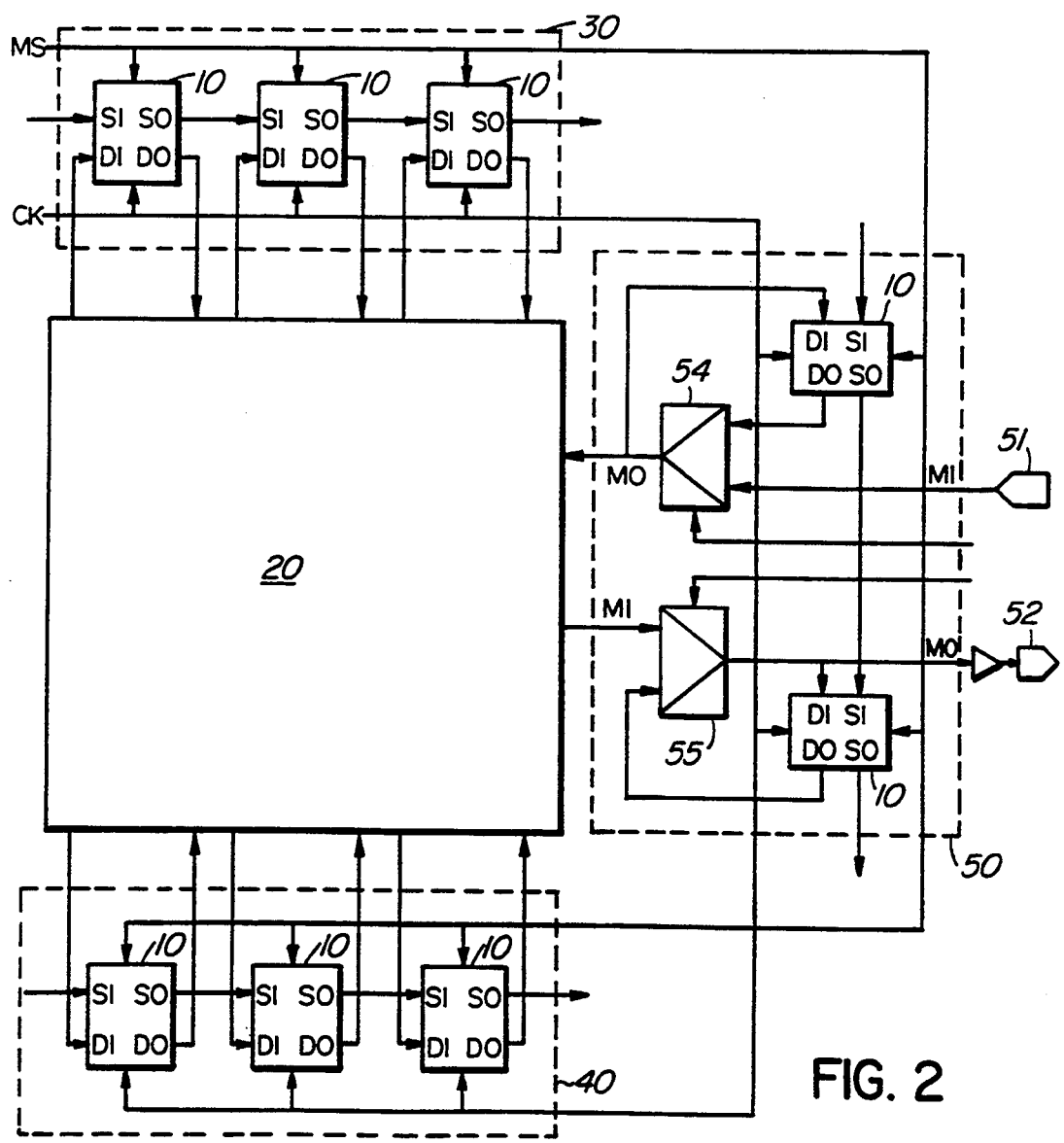
FIG. 2 is a block schematic diagram of scannable memory elements as shown in FIG. 1 connected to a combinational network to make a scan testable system.

FIG. 2 is a block schematic diagram showing a plurality of scannable memory elements 10 connected to a combinational network 20 so as to permit scan testing of the combinational network 20. The memory elements 10 are configurable in a normal operation mode by applying a mode select signal MS which causes selection of the data input DI at each memory element 10. In this normal operation mode, the memory elements 10 are interconnected by the combinational network 20 and provide memory functions which are essential to the operation of the combinational network 20.

The memory elements 10 are also configurable in a scan mode by applying a mode select signal MS which causes selection of the scan input SI at each memory element 10. In this scan mode the data inputs D of the flip-flops 14 of the memory elements 10 are decoupled from the combinational network 20 by the data multiplexor 12, and coupled to scan outputs SO of other memory elements 10 to define three scan chains 30, 40, 50. The scan chains 30, 40, 50 operate as shift registers into and out of which data patterns can be clocked.

One of the scan chains 30, 40, 50 is called a boundary scan chain 50 because it is connected between the combinational network 20 and input and output terminals 51, 52 which can be used to connect the combinational network 20 to external networks. The boundary scan chain 50 includes data selectors in the form of multiplexors 54, 55 connected between each input and output terminal 51, 52 and respective data inputs and outputs of the combinational network 20. The multiplexors 54 which are connected to the input terminals 51 can be used to isolate corresponding inputs of the combinational network 20 from the input terminals 51 during scan testing of the combinational network 20 in isolation from external networks. The multiplexors 55 which are connected to the output terminals 52 can be used to isolate the output terminals 52 from corresponding outputs of the combinational network during scan testing of external networks in isolation from the combinational network 20.

In normal scan testing of the combinational network 20, the scannable memory elements 10 are configured in scan mode by application of a suitable mode select signal MS, and a known test stimulus pattern is clocked into each scan chain 30, 40, 50 at a common test clock rate. The scannable memory elements 10 are then reconfigured in normal operation mode by changing the mode select signal MS for at least one test clock cycle so that the combinational network 20 performs logical operations on some of the data making up the test stimulus patterns and alters the data stored in some of the scannable memory elements 10. The scannable memory elements 10 are then reconfigured in scan mode by changing the mode select signal MS, and test response patterns are clocked out of each scan chain 30, 40, 50 at the common test clock rate. The test response patterns are compared with expected test response patterns to determine whether the combinational network 20 and memory elements 10 are functioning as expected.

The common test clock rate used for normal scan testing of the combinational network 20 is constrained by the maximum propagation delay through the combinational network 20 and by the source of the test clock signal. Consequently, the common test clock rate is generally lower than the clock rate used during normal operation for at least some of the memory elements 10, and the test results may not accurately represent the operation of those memory elements 10 and associated parts of the combination network 20 at normal operating speed. In particular, certain faults resulting from excessive propagation delays may go undetected.

Figure 3:
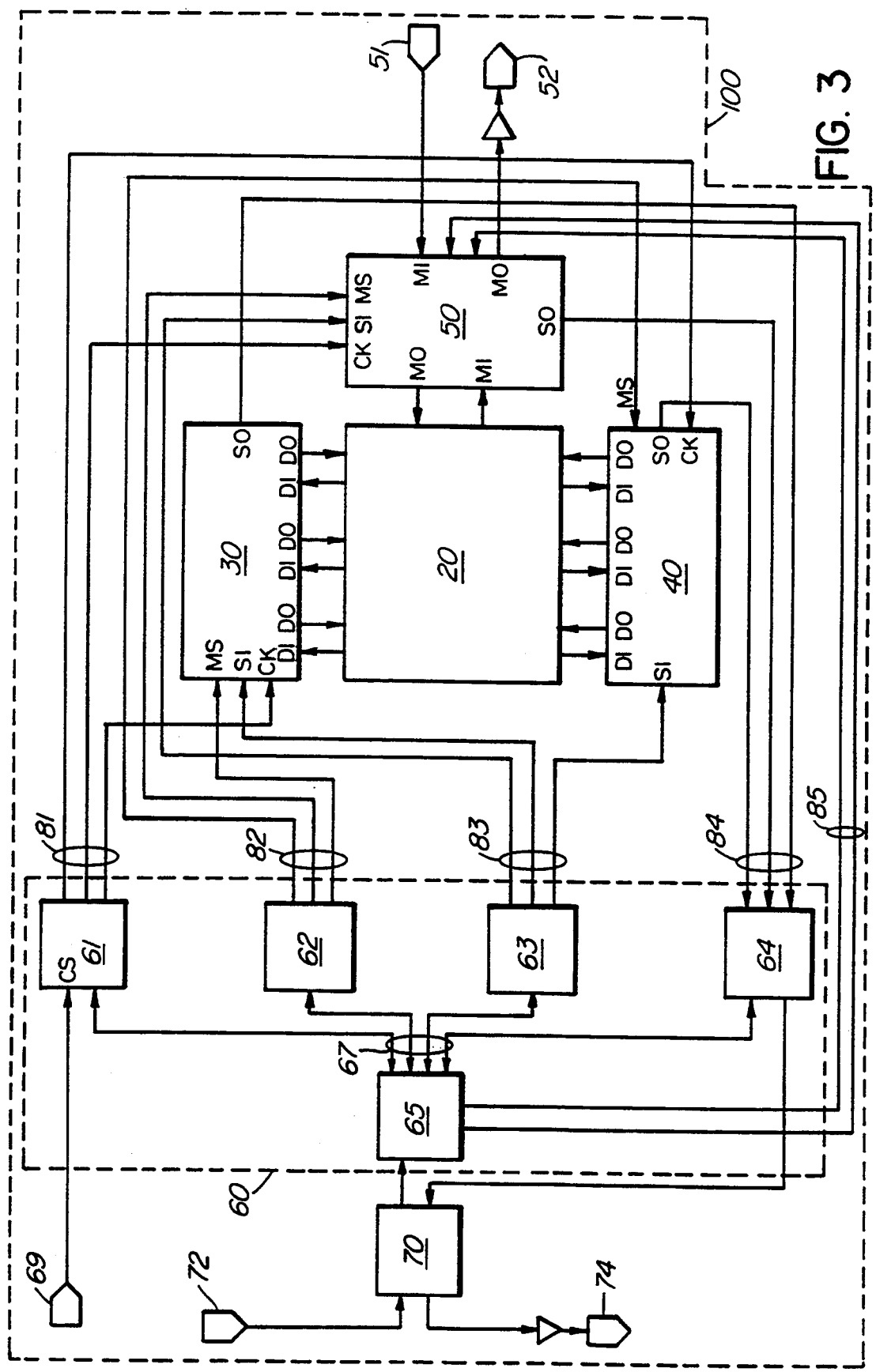
FIG. 3 is a block schematic diagram of a digital system according to an embodiment of the invention.

FIG. 3 is a block schematic diagram of a digital system 100 according to an embodiment of the invention. The digital system 100 comprises a combinational network 20 and a plurality of scannable memory elements as described above. The memory elements are configurable in a normal operation mode in which the memory elements are interconnected by the combinational network 20, and in a scan mode in which the memory elements are connected to define scan chains 30, 40, 50 as shown in FIG. 3. Each scan chain 30, 40, 50 has data inputs DI and data outputs DO corresponding to the data inputs and data outputs of individual memory cells of the scan chains 30, 40, 50. These data inputs DI and data outputs DO are connected to the combinational network 20 when the memory elements are configured in normal operation mode. One of the scan chains 30, 40, 50 is a boundary scan chain 50 having data inputs DI and data outputs DO connected to data inputs and data outputs of the combinational network 20 via multiplexors 54,55 as shown in greater detail in FIG. 2. Each scan chain 30, 40, 50 also has a scan input SI corresponding to the scan input of a memory element at an input end of that scan chain when the memory elements of that scan chain are configured in scan mode, and a scan output SO corresponding to the scan output of a memory element at an output end of that scan chain when the memory elements of that scan chain are configured in scan mode. Each scan chain 30, 40, 50 also has a clock input CK and a mode select input MS connected in parallel to clock and mode select inputs respectively of each memory element in that scan chain.

The digital system 100 further comprises a Built In Self Test (BIST) core 60 and a test access port (TAP) 70. The TAP 70 is a IEEE 1149.1 test interface and is connected to at least one test input terminal 72 and at least one test output terminal 74 of the digital system 100.

The BIST core 60 comprises a multiple clock generator 61, a configuration controller 62, a test stimulus pattern generator 63, a test response pattern processor 64 and some control logic 65. The control logic 65 has at least one input connected to the TAP 70 and outputs connected to the multiple clock generator 61, the configuration controller 62, the test stimulus pattern generator 63 and the test response pattern processor 64 via a control bus 67. The multiple clock generator 61 has an input connected to a system clock terminal 69 of the digital system 100 and respective outputs connected to the clock inputs CK of each scan chain 30, 40, 50 via a clock bus 81. The configuration controller 62 has respective outputs connected to the mode select inputs MS of each scan chain 30, 40, 50 via a mode select bus 82. The test stimulus pattern generator 63 includes a Linear Feedback Shift Register (LFSR) having respective outputs connected to the scan inputs SI of each scan chain 30, 40, 50 via a test stimulus bus 83, and the test response pattern processor includes a LFSR having respective inputs connected to the scan outputs SO of the scan chains 30, 40, 50 via a rest response bus 84. The control logic 65 also has outputs which are connected to multiplexors 54, 55 of the boundary scan chain 50 via a boundary scan control bus 85.

The entire digital system 100 is implemented as a single monolithic integrated circuit.

The digital system 100 is connected to an external tester via the test input and output terminals 72, 83 for scan testing. The TAP 70 passes standard protocol test control signals from the external tester to the control logic which derives appropriate control signals for the multiple clock generator 61, the configuration controller 62, the test stimulus pattern generator 63 and the test response pattern processor 64 to set up and control scan testing.

In the digital system 100, the scannable memory elements are grouped into scan chains according to their clock rate during normal operation of the digital system 100. In particular, each scan chain 30, 40, 50 consists of memory elements which are clocked at a single clock rate during normal operation, but the respective clock rates for at least two of the scan chains 30, 40 are different. The multiple clock generator 61 derives clock signals at each of the respective clock rates required for clocking the scan chains 30, 40, 50 from the system clock signal CS which operates at the highest of the respective clock rates. Clock signals at the required clock rates are coupled to the clock buses CK of the scan chains 30, 40, 50 via respective lines of the clock bus 81.

The configuration controller 62 responds to control signals from the control logic 65 to apply appropriate mode select signals to the mode select inputs MS of the scan chains 30, 40, 50 via respective lines of the mode select bus 82. Because the scan chains 30, 40, 50 do not all operate at the same clock rate, the respective mode select signals may differ as discussed in greater detail below.

The test stimulus pattern generator 63 operates at the highest respective clock rate of the scan chains 30, 40, 50 to generate pseudo-random test stimulus patterns. The test stimulus patterns are applied to the scan inputs SI of the scan chains 30, 40, 50 via the test stimulus bus 83.

The test response pattern processor 64 operates at the highest respective clock rate of the scan chains 30, 40, 50 to process test response patterns clocked out of the scan chains 30, 40, 50. The test response patterns are received from the scan outputs SO of each scan chain 30, 40, 50 via the test response bus 48. The test response pattern processor 64 "compresses" the test response patterns into a single test response signal for transmission to the external test equipment via the TAP 70 and the test output terminal 74. The external test equipment compares that test response signal to an expected test response signal which is stored in the external test equipment.

To initiate scan testing, the external tester sends appropriate signals to the TAP 70 which forwards appropriate control signals to the control logic 65. The control logic 65 derives appropriate control signals for the multiple clock generator 61, the configuration controller 62 and the test stimulus pattern generator 63 which are sent via the control bus 67. The configuration controller 62 applies appropriate mode select signals to the mode select bus 82 to configure the scan chains 30, 40, 50 in scan mode. The test stimulus pattern generator 63 generates test stimulus patterns which are applied to the test stimulus bus 83 while the multiple clock generator clocks the test stimulus patterns into the scan chains 30, 40, 50 at the respective clock rates of the scan chains 30, 40, 50. When the test stimulus patterns are fully loaded into all three scan chains 30, 40, 50, the configuration controller 62 applies appropriate mode select signals to the mode select bus 82 to reconfigure the scan chains 30, 40, 50 in normal operation mode for at least one clock cycle at the respective clock rate of each scan chain 30, 40, 50. During this time interval, the test stimulus patterns are applied to the combinational network 20, changing the data stored in at least some of the memory elements. The configuration controller 62 then applies appropriate mode select signals to the mode select bus 82 to reconfigure the memory elements in scan mode, so that test response patterns are clocked out of each scan chain 30, 40, 50 during subsequent clock cycles. The test response patterns are clocked out of the scan chains 30, 40, 50 via the test response bus 84 to the test response processor 64 which compresses the test response patterns into a single test response signal. The test response processor 64 then sends the single test response signal to the external test equipment via the TAP 70 for comparison with an expected test response signal stored in the external test equipment.

Figure 4:
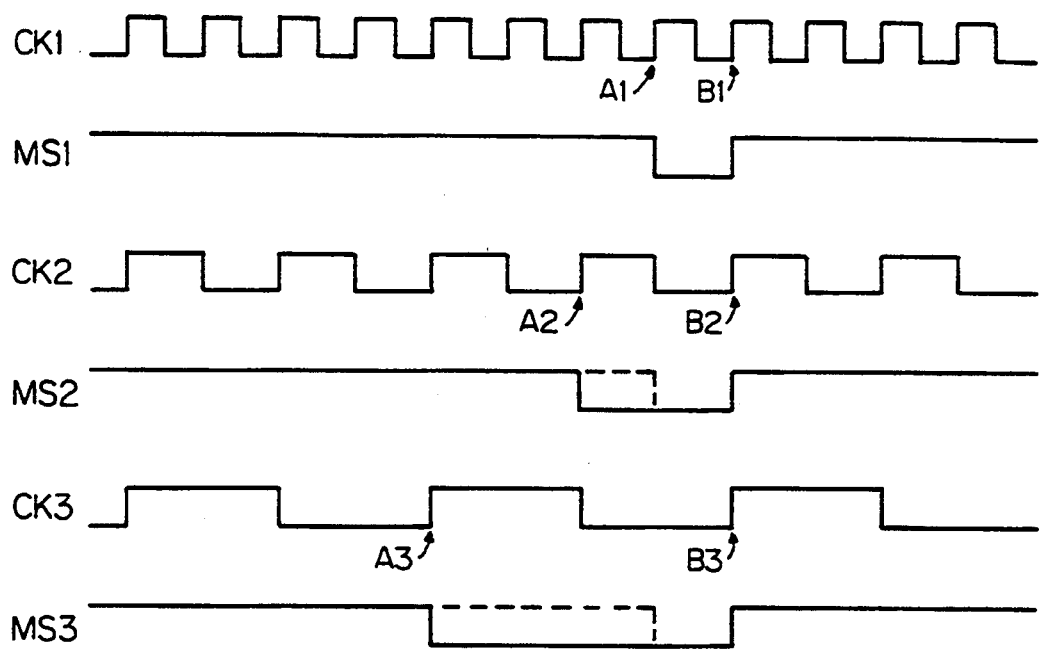
FIG. 4 is a timing diagram showing signals used in the testing of the digital system of FIG. 3.

FIG. 4 is a timing diagram for signals used in the test sequence described above. Clock signal CK1 and mode select signal MS1 are applied to scan chain 30, clock signal CK2 and mode select signal MS2 are applied to scan chain 40, and clock signal CK3 and mode select signal MS3 are applied to scan chain 50.

The edge-triggered flip-flops 14 of the memory elements 10 of each scan chain 30, 40, 50 are updated at each positive-going transition of their respective clock signal CK1, CK2, CK3. Test stimulus patterns are clocked from the test stimulus pattern generator 63 into each scan chain 30, 40, 50 during a respective scan-in interval with the respective mode select signals MS1, MS2, MS3 held high. All of the respective scan-in intervals overlap in time for a plurality of clock cycles of the highest rate clock CK1 and are long enough to ensure that test patterns fill each scan chain 30, 40, 50.

Beginning at transitions A1, A2, A3, the mode select signals MS1, MS2, MS3 are held low during respective normal mode intervals to configure the scan chains 30, 40, 50 in normal mode. Each normal mode interval corresponds to a single cycle of the corresponding clock CK1, CK2, CK3, all of the normal mode intervals overlapping for a common cycle of the highest rate clock CK1. The operation of the combinational network on the test stimulus patterns is sampled at transitions B1, B2, B3 to collect test response patterns.

After transitions B1, B2, B3, the mode select signals MS1, MS2, MS3 are held high during respective scan-out intervals of the scan chains 30, 40, 50 to configure the memory elements of each scan chain 30, 40, 50 in scan mode. The test response patterns are clocked out of the scan chains 30, 40, 50 to the test response processor 67 at positive-going transitions of the clock signals CK1, CK2, CK3 during the respective scan-out intervals. All of the respective scan-out intervals overlap for a plurality of clock cycles at the highest clock rate CK1 and are long enough to ensure that test patterns are completely clocked out of each scan chain 30, 40, 50.

Thus, the test stimulus patterns are clocked into all scan chains 30, 40, 50 during overlapping time intervals, the memory elements of all scan chains 30, 40, 50 are configured in normal operation mode during overlapping time intervals, and test response patterns are clocked out of all of the scan chains during overlapping intervals. This provides a relatively efficient test which accurately simulates the normal operation of the combinational network 20 and memory elements 10, some of which are clocked at different rates than others during normal operation. The test response patterns are collected by updating all memory elements 10 during a common period of the highest rate clock signal CK1 at transitions B1, B2, B3 while the memory elements 10 are configured in normal operation mode.

Problems can arise where one or more of the clock signals CK1, CK2, CK3 is phase-shifted or "skewed" with respect to the others. For example, if a "sending" memory element supplies data to a "receiving" memory element and the clock signal applied to the receiving memory element lags the clock signal applied to the sending memory element, the receiving memory element may sample its data after the sending memory element has updated its data, thereby getting the wrong data.

Figure 5:
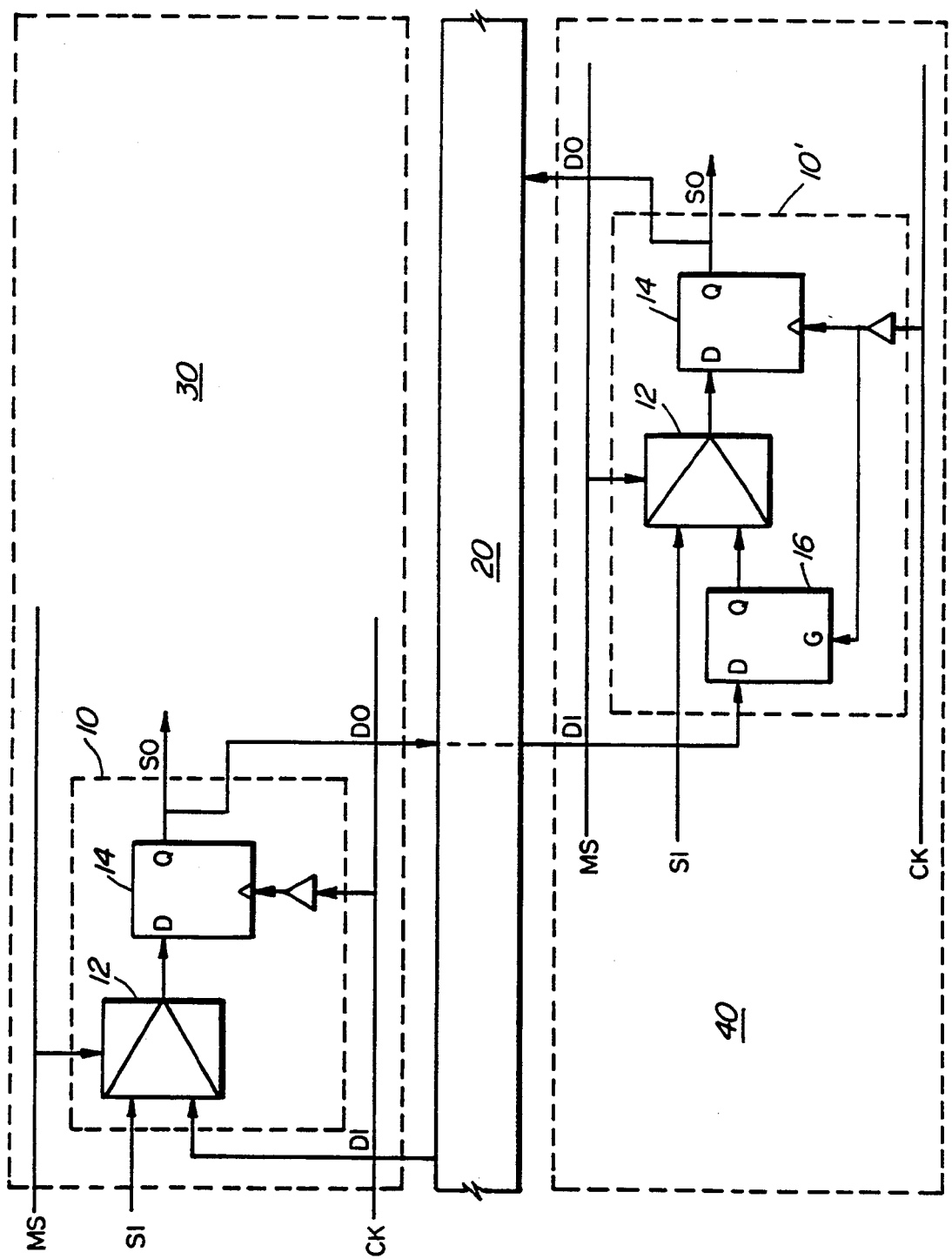
FIG. 5 is a block schematic diagram showing part of the digital system of FIG. 3, including a modified scannable memory element.

Such problems can be avoided by adopting a two-edge clocking scheme. For example, the receiving memory element 10 may be replaced by a modified memory element 10' having a retiming latch 16 at its data input, as shown in FIG. 5. The retiming latch 16 blocks data from the sending memory element 10 so that the memory element 10' effectively samples data one half clock period earlier.

Figure 6:
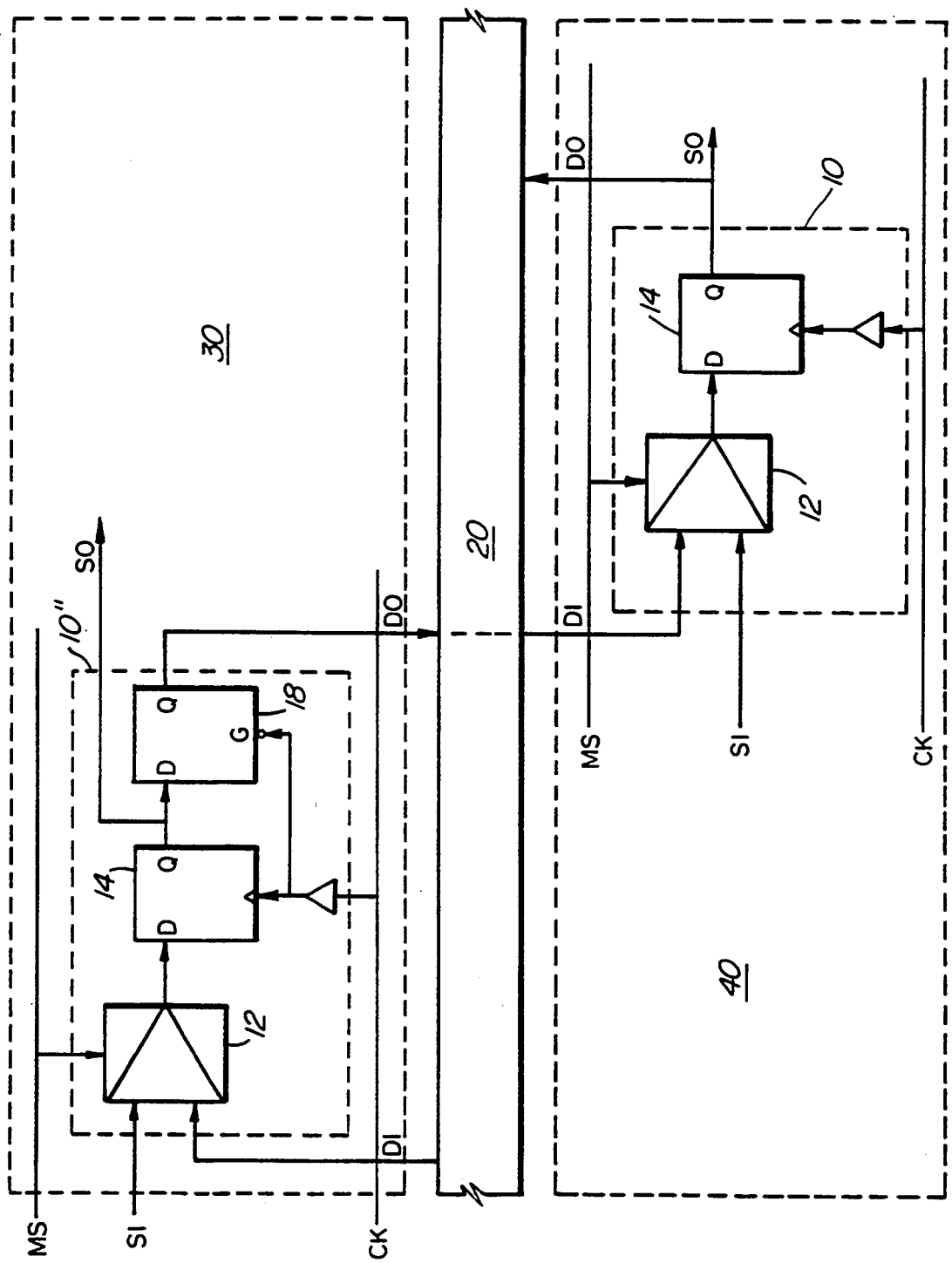
FIG. 6 is a block schematic diagram showing part of the digital system of FIG. 3, including another modified scannable memory element.

Alternatively, the sending memory element 10 may be replaced by a modified memory element 10" having a retiming latch 18 at its data output, as shown in FIG. 6. The retiming latch 18 holds data at the output of the sending memory element 10" for one half clock period to ensure that the receiving memory element 10 samples the desired data.

Clock skew problems can also be resolved by adopting two-phase clocking schemes, such as the clocking scheme disclosed in U.S. Pat. No. 4,912,340 issued Mar. 27, 1990 in the names of Wilcox et al and entitled Circuit for Generating Non-Overlapping Two-Phase Clocks. The specification of U.S. Pat. No. 4,912,340 is hereby incorporated by reference.

Figure 7:
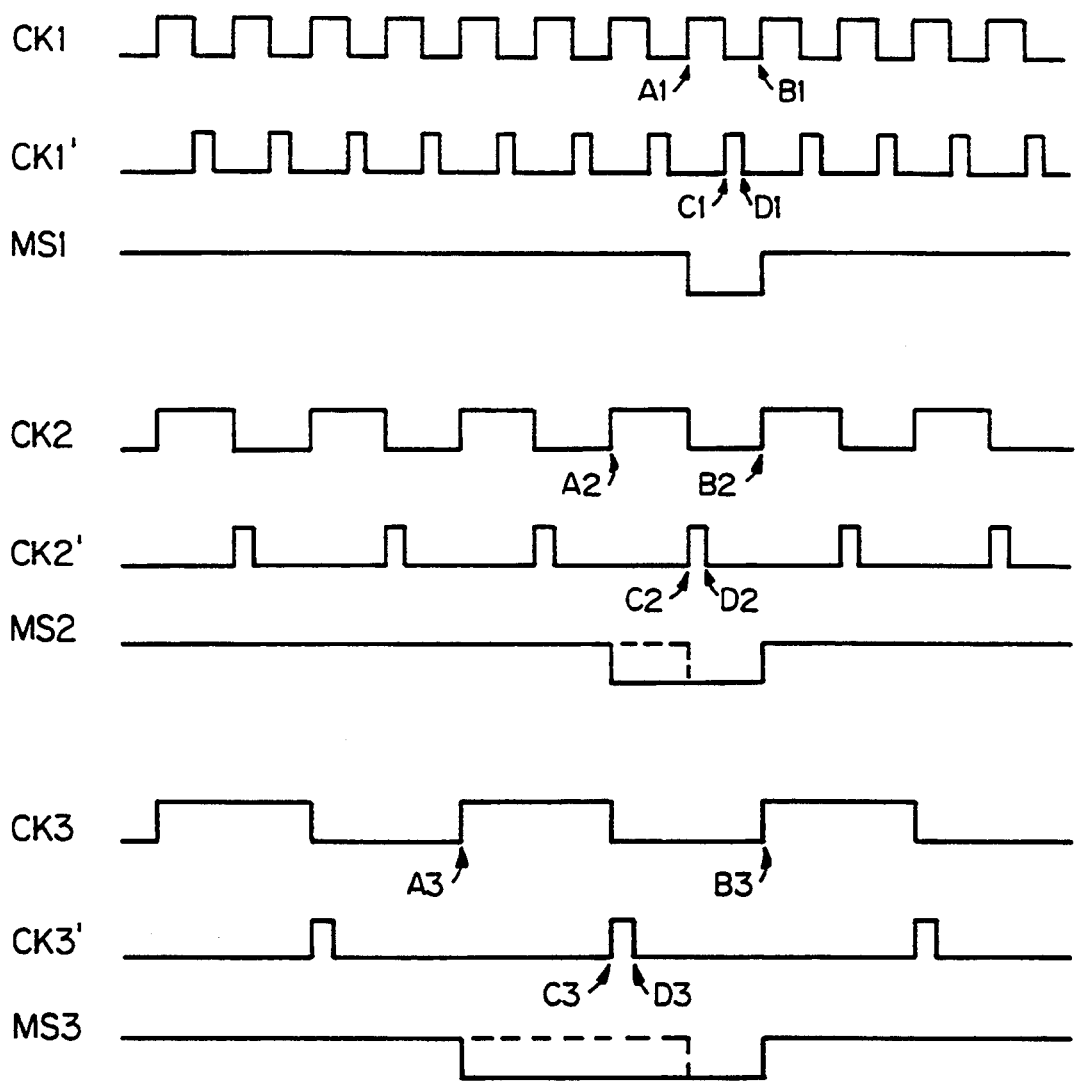
FIG. 7 is a timing diagram showing other signals that may be used in the testing of the digital system of FIG. 3.

In some digital systems, it may be desirable to include two or more of the edge-triggered, two-phase and two-edge clocking schemes discussed above to provide the operating characteristics desired during normal operation of the digital systems. FIG. 7 is a timing diagram illustrating that careful design is desirable where clocking schemes are mixed. Two-phase or two-edge clocking schemes require a second clock signal CK1', CK2', CK3' at each clock rate where such clocking schemes are to be used. The second clock signals CK1', CK2', CK3' can be derived from highest rate clock signal CK1.

As noted in the discussion of FIG. 4, test stimulus patterns are shifted into scan chains until transitions A1, A2, A3. The edge-triggered flip-flops are updated with data from the combinational network 20 at transitions B1, B2, B3, and that data is shifted out of the edge-triggered flop-flops at subsequent transitions. However, the two-edge triggered memory elements sample data from the combinational network 20 at transitions C1, C2, C3, and the two-phase triggered memory elements sample data from the combinational network 20 at transitions D1, D2, D3.

If data is sent through the combinational network 20 from scan chain 30 to scan chain 50 and the memory elements of scan chain 50 are two-edge or two-phase triggered, the memory elements of scan chain 50 are updated with data from the combinational network 20 at transitions C3, D3, before the scan chain 30 applies its complete test pattern to the combinational network 20 at transition A1. Consequently, the contents of scan chain 50 do not characterize the operation of the combinational network 20 on the complete test pattern loaded into scan chain 30. Such testing can provide reproducible test results of some value, but the fault coverage of such testing can only be calculated by modelling the scan chains 30, 50 and combinational network 20 together as a sequential circuit, and this can be a very difficult task. It is generally preferred to avoid such timing problems so that automatic test pattern generation software need only model the combinational network 20 as a relatively simple combinational circuit for calculation of fault coverage.

Such timing problems can be avoided by ensuring that all memory elements which receive data through the combinational network 20 from a scan chain clocked at a higher rate are edge-triggered flip-flops.

Figure 8:
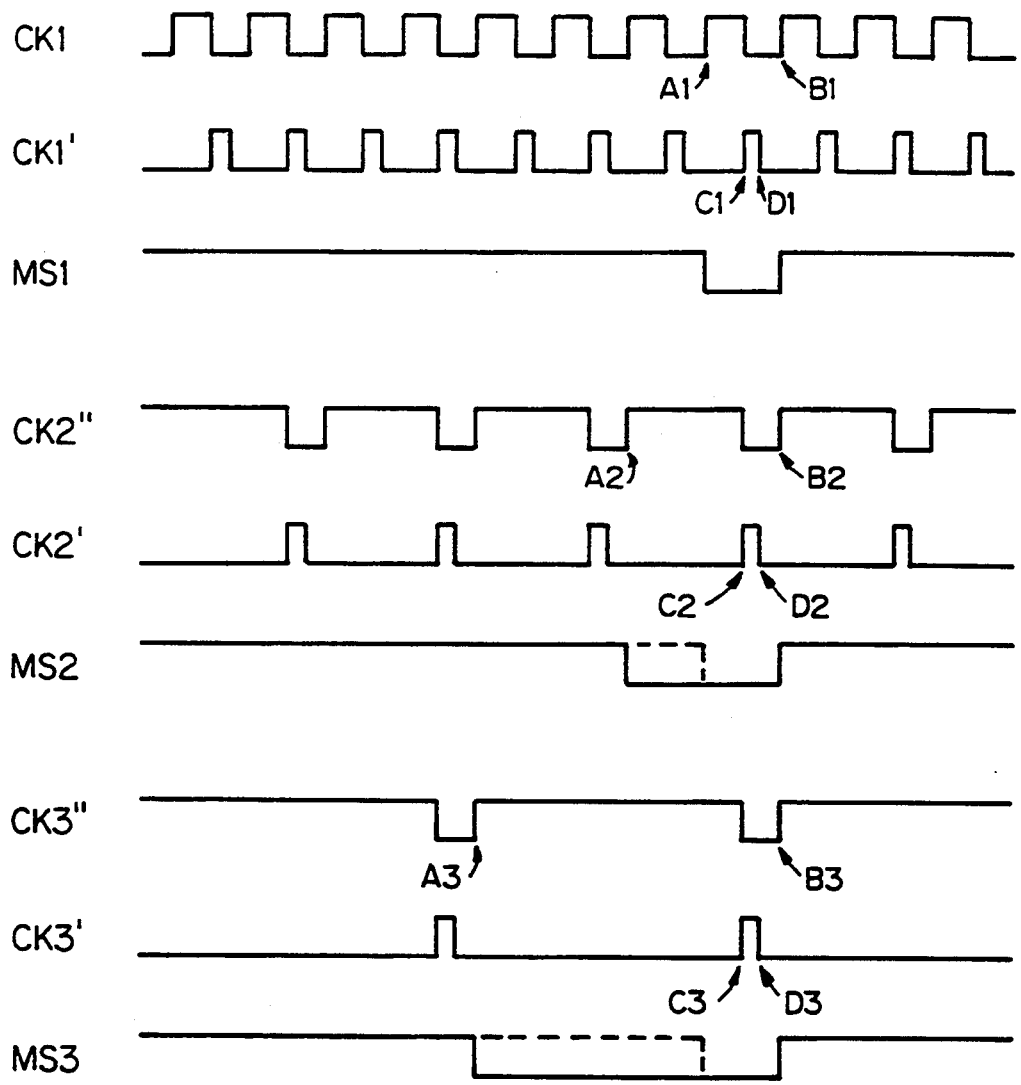
FIG. 8 is a timing diagram showing still other signals that may be used in the testing of the digital system of FIG. 3.

Alternatively, the timing scheme can be modified as shown in FIG. 8. In this case, the lower rate clock signals CK2, CK3 derived from the highest rate clock signal CK1 are replaced by clock signals CK2″, CK3″ having the same respective clock rates as CK2, CK3, but each having negative-going pulses of the same width as the negative-going pulses of CK1. This timing modification shifts the pulses of clock signals CK2′, CK3′ used for two-phase and two-edge clocking so that updating of memory elements at transitions C2, C3, D2, D3 always occurs after the test stimulus pattern is completely shifted into the highest rate scan chain 30 at transition A1.

An adequate test of the digital system 100 will generally require that a series of successive test stimulus pattern sequences be applied to the combinational network 20 to generate a series of successive test response pattern sequences. Each sequence of test response patterns may be compressed into a single test signature by the test response processor 67 and transmitted to the external tester for comparison with expected test signatures. Given that most faults appear during the early stages of testing, testing efficiency may be improved by employing a series of successive test pattern sequences in which each successive test pattern sequence is longer than preceding test pattern sequences, and by interrupting the series of test pattern sequences if a test signature resulting from any of the test pattern sequences does not correspond to the expected test signature for that test pattern sequence.

The embodiments of the invention which are described above may be modified without departing from the inventive concept.

For example, the timing diagrams of FIGS. 4, 7 and 8 show mode select signals MS1, MS2, MS3 which are each held low during a single cycle of the corresponding clocks CK1, CK2, CK3. In practical embodiments, the mode select signals MS1, MS2, MS3 will generally configure each scan chain 30, 40, 50 in normal operation mode during a respective normal mode interval, all of the respective normal mode intervals overlapping in time for at least one cycle of the highest rate clock CK1. However, it is not essential that the mode select signals MS1, MS2, MS3 configure the memory elements of each scan chain 30, 40, 50 in normal operation mode for a complete clock cycle at the respective clock rate of that scan chain. For example, the mode select signals MS1, MS2, MS3 could be held low during a single common cycle of the highest rate clock as shown in dotted outline in the timing diagrams of FIGS. 4, 7 and 8, although some special precautions would be needed in dealing with memory elements employing two-edge or two-phase clocking at clock rates significantly lower than the highest clock rate.

The test configuration described above is versatile enough to be used for scan test methods other than those described in detail above. For example, the boundary scan chain 50 is provided with a separate clock line of the clock bus 81 and can be clocked independently of the other scan chains 30, 40. Moreover, the isolating multiplexors 54, 55 of the boundary scan chain 50 can be separately controlled via the TAP 70, the control logic 65 of the BIST core 60 and a control bus 85, so the boundary scan chain 50 can be operated separately for sampling boundary conditions during normal operation of the digital system 100.

In the embodiments described above, the TAP 70 and BIST core 60 are implemented as part of a digital integrated circuit to be tested, and other test functions are provided by external test equipment connected to the digital circuit via the TAP 70. Alternative partitioning of the test functions is possible. For example, some or all of the TAP and BIST core functions could be removed from the digital integrated circuit and implemented in the external test equipment, or some external test equipment functions could be implemented as part of the digital integrated circuit. Generating multiple clock signals and test stimulus patterns and compressing test response patterns on the integrated circuit reduces requirements for high speed communications between the external test equipment and the digital integrated circuit under test, thereby facilitating testing of high speed digital integrated circuits at normal operating speeds.

The BIST core functions could also be configured differently. For example, U.S. Pat. No. 4,503,537 (referred to above) discloses a test system having a separate test stimulus pattern generator and a separate test response pattern analyzer used only in conjunction with a boundary scan chain.

The BIST core and TAP functions could also be implemented differently. For example, the TAP 70 need not be an IEEE 1149.1 test interface. Any suitable test interface would do. The test stimulus pattern generator 63 and the test response pattern processor 64 could be implemented in forms other than LFSRs. For example, they could be implemented as cellular automata. The multiple clock generator 61 could receive a basic clock signal from the external test equipment instead of deriving its clock signals from the system clock.

These and other modifications are within the scope of the invention as defined by the following claims.

We claim:

1. A method for testing a digital system comprising a plurality of scannable memory elements and at least one combinational network, the method comprising:
    configuring the memory elements in a scan mode in which the memory elements are connected to define a plurality of scan chains;
    clocking a test stimulus pattern into each of the scan chains at a respective clock rate, at least two of the clock rates being different from one another;
    configuring the memory elements of each scan chain in a normal operation mode in which the memory elements are interconnected by the combinational network for at least one clock cycle at a highest of the respective clock rates;
    configuring the memory elements in the scan mode; and
    clocking a test response pattern out of each of the scan chains at its respective clock rate.

2. A method for testing a digital system comprising a plurality of scannable memory elements and at least one combinational network, the method comprising:
    configuring the memory elements in a scan mode in which the memory elements are connected to define a plurality of scan chains;
    clocking a test stimulus pattern into each of the scan chains at a respective clock rate during a respective scan-in interval, at least two of the clock rates being different from one another, all respective scan-in intervals overlapping in tome for a plurality of clock cycles at a highest of the respective clock rates;

configuring the memory elements of each scan chain in a normal operation mode during a respective normal mode interval, the memory elements of each scan chain being interconnected by the combinational network in the normal operation mode, all respective normal mode intervals overlapping in time for at least one clock cycle at the highest of the respective clock rates;

configuring the memory elements in the scan mode; and clocking a test response pattern out of each of the scan chains at its respective clock rate during a respective scan-out interval, all respective scan-out intervals overlapping in time for a plurality of clock cycles at the highest of the respective clock rates.

3. A method as defined in claim 2, wherein the respective normal mode interval for each scan chain is a single clock cycle at the highest of the respective clock rates.

4. A method as defined in claim 3, comprising: repeating the steps of configuring the memory elements in a scan mode, clocking a test stimulus pattern into each scan chain, configuring the memory elements in a normal operation mode for a clock cycle, configuring the memory elements in the scan mode, and clocking a test result pattern out of each scan chain for each test stimulus pattern in a series of successive test pattern sequences, each successive test pattern sequence being longer than preceding test pattern sequences;

comparing a test signature resulting from each test pattern sequence to an expected test signature; and interrupting the series of test pattern sequences if a test signature resulting from a test pattern sequence does not correspond to the expected test signature for that test pattern sequence.

5. A method as defined in claim 2, wherein the respective normal mode interval for each scan chain is a single clock cycle at the respective clock rate of that scan chain.

6. A method as defined in claim 2, further comprising:

generating a test stimulus pattern in a random pattern generator operating at a highest of the respective clock rates of the scan chains; and processing test response patterns in a test signature processor operating the highest of the respective clock rates of the scan chains.

7. A method as defined in claim 6, wherein:

each scan chain consists of memory elements which are clocked at a single clock rate during normal operation; and the respective clock rate of each scan chain is substantially equal to the clock rate during normal operation of its memory elements.

8. A method as defined in claim 6, further comprising:

providing a first clock signal operating at the highest respective clock rate; and deriving clock signals operating at the other respective clock rates from the first clock signal.

9. A method as defined in claim 8, comprising updating all memory elements during a common period of the first clock signal when the memory elements are configured in normal operation mode.

10. A method as defined in claim 9, wherein:

the first clock signal comprises pulses having a predetermined pulse width; and the step of deriving clock signals comprises deriving clock signal operating at the other respective clock rates from the first clock signal, the derived clock signals comprising pulses having the predetermined pulse width.

11. A digital system comprising:

at least one combinational network;

a plurality of scannable memory elements, the memory elements being configurable in a normal operation mode in which the memory elements are interconnected by the combinational network and being configurable in a scan mode in which the memory elements are connected to define a plurality of scan chains;

a multiple clock generator for generating multiple clock signals for clocking test patterns into and out of each of the scan chains at a respective clock rate, at least tow of the clock rates being different from one another; and a configuration controller for configuring the memory elements in scan mode to permit clocking of test stimulus patterns into each scan chain at its respective clock rate, for reconfiguring the memory elements in normal operation mode for at least one clock cycle at a highest of the respective clock rates, and for reconfiguring the memory elements in scan mode to permit clocking of test response patterns out of each scan chain at its respective clock rate.

12. A digital system as defined in claim 11, further comprising:

a test stimulus pattern generator operable at the highest of the respective clock rates of the scan chains to generate test stimulus patterns for clocking into the scan chains; and a test response pattern processor operable at the highest of the respective clock rates of the scan chain to process test response patterns clocked out of the scan chains.

13. A digital system as defined in claim 12, implemented as an integrated circuit having at least one input terminal for connection of an input of the combinational network to an external network and at least one output terminal for connection of an output of the combinational network to an external network, the digital system further comprising:

a respective scannable memory element for each input terminal;

a respective input data selector operable to select between data applied to each input terminal and data stored in its respective scannable memory element for application to the corresponding input of the combinational network;

a respective scannable memory element for each output terminal; and a respective output data selector operable to select between data applied to each output of the combinational network and data stored in the scannable memory element for application to the corresponding output terminal.

14. A digital system as defined in claim 13, wherein the respective scannable memory elements for each input terminal and each output terminal are connected to form at least one boundary scan chain when the scannable memory elements are configured in scan mode.

15. A digital system as defined in claim 14, wherein the boundary scan chain is provided with its own clock network so that the boundary scan chain can be clocked independently of other scan chains.

16. A digital system as defined in claim 13, further comprising a test access port, the test access port being coupled to at least one input terminal for receiving control signals from an external tester and at least one output terminal for sending test results to the external tester.

17. A digital system as defined in claim 12, wherein the multiple clock generator comprises means for deriving clock signals at the other respective clock rates from a clock signal operating at the highest respective clock rate.

18. A digital system as defined in claim 17, wherein the multiple clock generator comprises means for deriving two different clock signals at at least one of the respective clock rates for two phase clocking of memory elements in a scan chain operating at that respective clock rate.

19. A digital system as defined in claim 11, wherein:
a first memory element of a first scan chain clocked at a first clock rate supplies data via a combinational network to a second memory element of a second scan chain clocked at a second clock rate lower than the first clock rate when the memory elements are configured in normal operation mode; and
the scannable memory elements of the second scan chain are edge triggered flip-flops.

* * * * *